United States Patent

Chudo et al.

[11] Patent Number: 4,720,437
[45] Date of Patent: Jan. 19, 1988

[54] SURFACE-COATED CEMENTED CARBIDE ARTICLE OR PART

[75] Inventors: Masuo Chudo; Toshio Nomura; Toshihiro Iida, all of Itami, Japan

[73] Assignee: Sumitomo Electric Industries, Ltd., Osaka, Japan

[21] Appl. No.: 842,805

[22] Filed: Mar. 21, 1986

[30] Foreign Application Priority Data

Mar. 27, 1985 [JP] Japan .................. 60-62800

[51] Int. Cl.$^4$ .................. B32B 7/02; B32B 15/18; B32B 17/06
[52] U.S. Cl. .................. 428/698; 428/699; 428/336
[58] Field of Search .............. 428/336, 698, 699, 457, 428/472

[56] References Cited

U.S. PATENT DOCUMENTS

| 3,977,061 | 8/1976 | Lindstrom et al. | 428/698 X |
| 4,019,873 | 4/1977 | Reiter | 428/698 X |
| 4,237,184 | 12/1980 | Gonseth et al. | 428/336 |

FOREIGN PATENT DOCUMENTS

| 0074759 | 3/1983 | European Pat. Off. | |
| 0083043 | 7/1983 | European Pat. Off. | |
| 3039775 | 5/1981 | Fed. Rep. of Germany. | |
| 3234943 | 4/1983 | Fed. Rep. of Germany. | |
| 0003670 | 1/1981 | Japan | 428/699 |
| 2006727 | 5/1979 | United Kingdom. | |

*Primary Examiner*—Nancy A. B. Swisher
*Attorney, Agent, or Firm*—Wenderoth, Lind & Ponack

[57] ABSTRACT

A cemented carbide article or part having a hard coating excellent in heat shielding effect and initial wear resistance is described in which the hard coating comprises an inner layer of TiC and an outer layer of TiC, and an intermediate layer, provided between the inner layer and outer layer, consisting of at least one layer selected from the group consisting of a single layer of TiN and a composite layer with such a structure that a TiN layer is sandwiched in between TiCN layers.

3 Claims, 2 Drawing Figures

SURFACE-COATED CEMENTED CARBIDE ARTICLE OR PART

BACKGROUND OF THE INVENTION

1. Field of the Invention

This invention relates to surface-coated cemented carbide articles and more particularly, it is concerned with surface-coated cemented carbide articles or parts, for example, for cutting tools having hard coating layers, capable of resisting severer cutting conditions.

2. Description of the Prior Art

It is well known in cutting tools that the temperature of a tool edge is 800° C. or higher during cutting. As the temperature of an edge becomes higher, a cemented carbide such as WC-Co deforms by heat to lower the flank wear resistance. Various surface-coated cemented carbides having hard coating layers have thus been used so as to improve the cutting property, but the effects of these hard coating layers are not sufficient and the above described problem has not been solved. Thus, the life of such a tool is often shortened by deformation due to heat of the cemented carbide as a substrate.

When a cemented carbide is coated with a hard layer, the strength of an edge is lowered as compared with the cemented carbide as a substrate and thus the tool tends to be broken and can hardly exhibit high effectiveness for any of many kinds of workpieces such as of steel or cast iron.

The coating layers can be divided broadly into two categories: (1) single layers of TiC, TiCN or TiN and composite layers thereof, which will hereinafter be referred to as "Ti compound system" and (2) coating layers comprising an $Al_2O_3$ layer as the outermost layer, which will hereinafter be referred to as "$Al_2O_3$ system". Typical of the coating of Ti compound system are those described in Japanese Patent Publication No. 24982/1976 which discloses a film structure comprising an inner layer of TiC and an outer layer of TiN, or an inner layer of TiC, an intermediate layer of TiCN and an outer layer of TiN such that the nitrogen content is gradually increased from the inside to the outside, the film structure having both an excellent rake surface wear resistance and flank wear resistance. In the coating layer structure of this kind, however, the substrate of a cemented carbide tends to deform by heat generated during cutting, for example, in the case of heavy cutting or high speed cutting and the effects by coating hard layers are not sufficiently exhibited in wear resistance.

In general, when the wear of a tool is increased to some extent, the cutting resistance is increased, thus resulting in rapid progress of wearing and breakage of the edge, so that the life of the tool becomes unstable. Lately, stabilization of the tool life has been required for the purpose of elimination or reduction of labor in cutting operation and there has been a tendency of exchanging a tool for another when the flank wear width reaches approximately 0.1 to 0.15 mm, although in the prior art, a tool was generally used until reaching a flank wear width of about 0.2 to 0.3 mm. The flank wear width of approximately 0.1 to 0.15 mm has been called the initial flank wear width which will hereinafter be referred to as "initial wear" and of late, this initial wear resistance has been considered as an important factor to govern the tool life.

On the other hand, $Al_2O_3$-coated cemented carbides, for example, as disclosed in Japanese Patent Publication No. 13201/1977, show an excellent wear resistance in high speed cutting because of the excellent heat resistance and nonreactivity with steels of $Al_2O_3$, but have a problem of breakage resistance because of the brittleness of $Al_2O_3$ itself.

SUMMARY OF THE INVENTION

It is an object of the present invention to provide surface-coated cemented carbide articles or parts for cutting tools whereby the above described disadvantages of the prior art can be overcome.

It is another object of the present invention to provide a cemented carbide part having a coating excellent in heat shielding effect as well as initial wear resistance.

It is a further object of the present invention to provide a cutting tool having an excellent breakage resistance and long life.

These objects can be attained by a cemented carbide article having a hard coating layer on the surface thereof, in which the hard coating layer comprises an inner layer of TiC and an outer layer of TiC, and an intermediate layer, provided between the inner layer and outer layer, consisting of at least one layer selected from the group consisting of a single layer of TiN and a composite layer with such a structure that a TiN layer is sandwiched between TiCN layers.

BRIEF DESCRIPTION OF THE DRAWING

The accompanying drawings are to illustrate the principle and merits of the invention in greater detail.

DETAILED DESCRIPTION OF THE INVENTION

Figure 1:
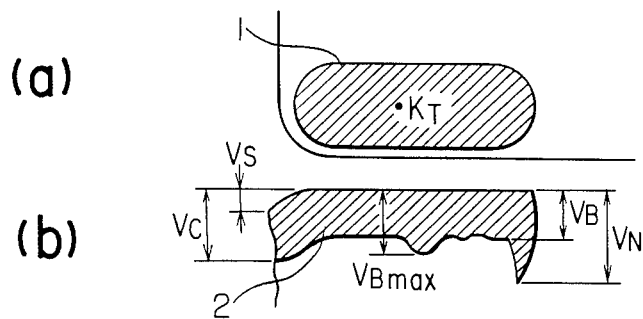
FIG. 1 is a typical view for showing a broken state of an insert after cutting: (a) top view and (b) front view; 1 rake face, 2 flank face, $K_T$ depth of crater, $V_S$ thermal deformation, $V_B$ flank wear width, $V_C$ nose wear, $V_N$ flank notch wear.

We, the inventors, have made various efforts to obtain a surface-coated cemented carbide article with the structure of a coating layer more excellent in heat shielding effect and initial wear resistance than Ti-compound coated cemented carbides.

In Ti compounds, the thermal conductivity is in the order of TiC, TiCN and TiN, i.e. TiC having the highest thermal conductivity, and the hardness is in the order of TiC, TiCN and TiN, i.e. TiC having the highest hardness. Table 1 shows the properties of TiC and TiN. TiCN has intermediate properties between them. The data of Table 1 are described in R. Funk "Coating of Cemented Carbide Cutting Tools with Alumina by Chemical Vapor Deposition" (J. Electrochem. Soc., Vol. 123, No. 2 (16)).

TABLE 1

|  |  | TiN | TiC |
|---|---|---|---|
| Microhardness (kg/mm$^2$) | 20° C. | 1,950 | 3,200 |
| Thermal Conductivity (Cal/cm. S. °C.) | 20° C. | 0.048 | 0.078 |
|  | 1,000° C. | 0.063 | 0.099 |

In order to reduce the heat transfer to a cemented carbide substrate during cutting, it is desirable to coat TiN with a lower thermal conductivity material, but when using TiN only, the wear resistance is inferior because of the lower hardness than TiC. Thus, in order to exhibit effectively the heat shielding effect of TiN, we have noted that TiN has a lower thermal conductivity at a relatively lower temperature and have coated TiN as an inner layer at a relatively lower temperature of the coating layers during cutting, followed by coating TiC as an outer layer. It is assumed that the initial wear resistance of a tool is governed by the wear resistance of an outer layer within a range of about 3 microns in the coating layer and if TiC excellent in wear resistance is coated as an outer layer, an excellent initial wear resistance can be obtained, thus protecting TiN as a heat shielding layer.

When a surface-coated cemented carbide tool having the above described coating structure is made and subjected to estimation of the cutting property using a steel workpiece, deformation of the cemented carbide substrate by heat is reduced and the initial wear is also reduced as compared with the prior art coating structure consisting of an inner layer of TiC and an outer layer of TiN, but there arises a problem that the wear resistance is inferior thereto in cutting of castings. Thus a, comparison of both tools is carried out as to the bonding strength between the coating layer and cemented carbide substrate in order to learn the cause of the above described problem and consequently, it is found that the use of TiC as an inner layer results in a higher bonding strength than the use of TiN as an inner layer.

That is, when a tool is prepared by coating a cemented carbide substrate with TiC as an innermost layer, with TiN as an intermediate layer and with TiC as an outermost layer and is evaluated, it is found that as compared with the Ti-compound coated cemented carbides of the prior art, the thermal deformation of the cemented carbide substrate is reduced, the initial wear resistance is increased, better results are also given in cutting of castings and the adaptability to workpieces to be cut is more enhanced.

Furthermore, the advantages or merits of the present invention can be more effectively given by allowing TiCN having intermediate properties to exist between the layers of TiC and TiN so as to increase the bonding strength between the coating layers, to moderate the crystal strain and to increase the strength of the coating itself.

Accordingly, the present invention provides a cemented carbide article or part having a hard coating layer on the surface thereof, in which the hard coating layer comprises an inner layer of TiC and an outer layer of TiC, and an intermediate layer, provided between the inner layer and outer layer, consisting of a single layer of TiN or a composite layer with such a structure that a TiN layer is sandwiched in between TiCN layers. If necessary, $Al_2O_3$ can further be coated as an outermost layer, preferably having a thickness of 0.5 to 5$\mu$.

In the surface-coated cemented carbide article of the present invention, the substrate or base member used consists of cemented carbides which are sintered products containing one or more materials selected from carbides and carbonitrides of one or more metals selected from titanium, zirconium, hafnium, vanadium, columbium, tantalum, chromium, molybdenum and tungsten, cemented by one or more metals selected from the iron group, that is, iron, nickel and cobalt, in general, in a proportion of up to 30% by weight. Coating of a cemented carbide substrate with TiC TiN, TiCN and $Al_2O_3$ is generally carried out by the so-called chemical vapor deposition method.

Generally, a cemented carbide article coated with a hard layer has the disadvantage, as well known in the art, that the edge strength is lower than that of the cemented carbide substrate and the tool tends to be broken.

We have made studies in order to overcome this disadvantage and consequently, have found that the breakage resistance of a tool can be made higher than Ti-compound coated cemented carbides of the prior art by the coating structure wherein each of the TiC layers and TiN layer have a film thickness of 0.5 to 2.5$\mu$ according to the present invention. For example, when a tool having a Ti-compound coating structure of the prior art, in which the inner layer of TiC has a thickness of 5$\mu$ and the outer layer of TiN has a thickness of 2.5$\mu$, is compared with another tool having a coating structure of the present invention, in which the inner layer and outer layer of TiC each has a thickness of 2.5$\mu$ and the intermediate layer of TiN has a thickness of 2.5$\mu$, the tool of the present invention is markedly superior to that of the prior art with respect to the breakage resistance, although they have the same overall thickness of TiC and TiN. The reason therefor can be assumed as follows: In the tool of the present invention, TiC is coated separatedly in two layers, so that the grain growth is suppressed as compared with the case of coating a single layer of TiC with the same thickness as the total thickness of the two layers, and propagation of cracks is thus diffused through the fine grains, thus preventing the tool from breakage.

In this case, the effects are substantially the same in both the cases where the intermediate layer is of a single layer of TiN and a composite layer of TiN and TiCN. When TiCN is coated between TiC and TiN layers, the toughness is further improved. In this case, the breakage resistance can further be increased if the TiC and TiN layers each has a film thickness of 0.5 to 2.5$\mu$ and the TiCN layer has a film thickness of 0.1 to 2.5$\mu$. If the thickness of the each layer exceeds 2.5$\mu$, the effect of making fine the crystal grains is decreased and the breakage resistance is lowered, while if the thickness of TiC and TiN are respectively less than 0.5$\mu$, there are little effects of shielding heat and improving the wear resistance and if the thickness of TiCN is less than 0.1$\mu$, there is little effect of improving the toughness.

As described above, the coating structure of the present invention consists in a basic structure of TiC/TiN/TiC and at least one of this multilayer is required. In a preferable embodiment, a more stable tool can be obtained by coating repeatedly a plurality of the multilayers.

Another feature of the present invention resides in the provision of a surface-coated cemented carbide article or part having an excellent heat resistance in addition to the above described properties by further coating the coating layer having the above described basic structure with $Al_2O_3$ as an outermost layer. In this case, however, if the thickness of the $Al_2O_3$ film is less than 0.5$\mu$, the effect of this coating is little, while if more than 5.0$\mu$, the breakage resistance of a tool edge is remarkably lowered. Thus, the thickness should preferably be 0.5 to 5.0$\mu$ and a range of 0.5 to 3.0$\mu$ is more preferable for holding the toughness.

In order to increase the bonding strength of the $Al_2O_3$ film, a bonding layer of TiBN, TiCBN, TiCO, TiNO or TiCNO with a thickness of 0.3 to 1.0$\mu$ can be provided between the TiC layer and $Al_2O_3$ layer without reduction of the advantages of the present invention.

Furthermore, a TiN layer with a thickness of less than 2.0μ can be coated for the purpose of coloring onto the outside of the Al$_2$O$_3$ layer without affecting the advantages of the present invention.

The following examples are given in order to illustrate the present invention in detail without limiting the same.

EXAMPLE 1

A cemented carbide of ISO P30 (commercial name) was coated with coating layers as shown in Tables 2 and 3 by the known chemical vapor deposition method and then subjected to estimation of the cutting properties, thus obtaining results as shown in Tables 2 and 3. The method of estimating the cutting properties is shown in Table 4. In each of Tables 2 and 3, the total film thickness was adjusted to the same.

In Sample No. 2, the quantity of thermal deformation is less than in Sample Nos. 1 and 3, but on the contrary, the flank wear width is larger. It is assumed from this result that TiN is effective for heat shielding but decreases the bonding strength of the coating layer. On the other hand, Sample Nos. 4, 5 and 6 of the present invention show lower quantities than Samples 1, 2 and 3 for comparison as to the quantity of thermal deformation, initial flank wear width, flank wear width and breakage ratio, i.e. the former having more excellent cutting properties than the latter. It is assumed that the decrease of the breakage ratio according to the present invention in comparison with the prior art articles is probably due to the fact that since the layers are thinly divided and coated, propagation of cracks is dispersed or diffused and shock is absorbed. In Table 3 wherein the total thickness is increased to 1.7 times the total thickness of Table 2, Sample Nos. 8 and 9 of the present invention show less quantities than Sample No. 7 for comparison as to the quantity of thermal deformation and flank wear width, i.e. showing improved cutting properties, but Sample No. 8 is not so different from Sample No. 7 in the breakage ratio. This is probably due to the fact that since the thickness of the each layer is larger, the effect by dividing the coating layer cannot be exhibited. On the other hand, Sample No. 9 shows a lower breakage ratio than the comparative sample, which is probably due to that the thickness of the each layer is smaller. Therefore, it is desirable in order to improve the breakage resistance that the each layer has a film thickness of less than 2.5μ.

TABLE 2

| Sample No. | Coating Layer Structure (μ) Inner Layer ⟷ Outer Layer | | | | | Total Thickness | Cutting Properties* | | | |
|---|---|---|---|---|---|---|---|---|---|---|
| | | | | | | | (I) | (II) | (III) | (IV) |
| Comparison | | | | | | | | | | |
| 1 | TiC 5.0 | TiN 2.5 | | | | 7.5 | 0.174 | 0.103 | 0.234 | 53 |
| 2 | TiN 2.5 | TiC 5.0 | | | | 7.5 | 0.117 | 0.114 | 0.270 | 51 |
| 3 | TiC 4.0 | TiN 3.5 | | | | 7.5 | 0.152 | 0.108 | 0.242 | 48 |
| Our Invention | | | | | | | | | | |
| 4 | TiC 2.5 | TiN 2.5 | TiC 2.5 | | | 7.5 | 0.101 | 0.082 | 0.203 | 37 |
| 5 | TiC 1.0 | TiN 2.5 | TiC 0.5 | TiN 1.0 | TiC 2.5 | 7.5 | 0.105 | 0.075 | 0.214 | 32 |
| 6 | TiC 2.0 | TiCN 1.0 | TiN 1.5 | TiCN 1.0 | TiC 2.0 | 7.5 | 0.103 | 0.089 | 0.187 | 28 |

Note:
*(I) Quantity of Thermal Deformation (mm)
(II) Initial Flank Wear Width (mm)
(III) Flank Wear Width (mm)
(IV) Breakage Ratio (%)

TABLE 3

| Sample No. | Coating Layer Structure (μ) Inner Layer ⟷ Outer Layer | | | | | Total Thickness | Cutting Properties* | | |
|---|---|---|---|---|---|---|---|---|---|
| | | | | | | | (I) | (III) | (IV) |
| Comparison | | | | | | | | | |
| 7 | TiC 6.5 | TiN 6.0 | | | | 12.5 | 0.098 | 0.160 | 95 |
| Our Invention | | | | | | | | | |
| 8 | TiC 3.5 | TiN 6.0 | TiC 3.0 | | | 12.5 | 0.063 | 0.133 | 90 |
| 9 | TiC 2.5 | TiCN 2.5 | TiN 2.5 | TiCN 2.5 | TiC 2.5 | 12.5 | 0.062 | 0.130 | 67 |

Note:
*(I), (III) and (IV) same as in Table 2

TABLE 4

| | Workpiece (Hardness) | Cutting Speed (m/min) | Feed (mm/rev) | Depth of Cut (mm) | Cutting Time (min) | Tool Form No. |
|---|---|---|---|---|---|---|
| Quantity of Thermal Deformation* | SK 5 (H$_B$ 250) | 100 | 0.74 | 1.5 | 5 | SNMG 432 |

TABLE 4-continued

| | Workpiece (Hardness) | Cutting Speed (m/min) | Feed (mm/rev) | Depth of Cut (mm) | Cutting Time (min) | Tool Form No. |
|---|---|---|---|---|---|---|
| Initial Flank Wear Width | SCM 435 ($H_B$ 250) | 150 | 0.37 | 2.0 | 10 | SNMG 432 |
| Flank Wear Width | SCM 435 ($H_B$ 250) | 150 | 0.37 | 2.0 | 30 | SNMG 432 |
| Breakage Ratio** | SCM 435 with groove ($H_B$ 250) | 60 | 0.17–0.27 | 1.5 | 0.5 | SNMG 432 |

Figure 2:
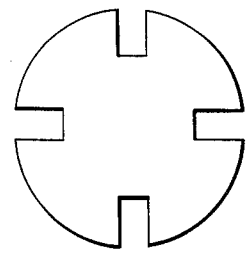
FIG. 2 is a cross sectional view of a workpiece to be cut used in a cutting test.

Note:
*Quantity of thermal deformation is represented by Vs in FIG. 1 showing a broken state of a cutting insert after cutting.
**Breakage ratio is a relative value in a 10 edges' cutting test of a grooved workpiece having a cross section as shown in FIG. 2.

EXAMPLE 2

A cemented carbide of ISO P 10 (commercial name) was coated with coating layers as shown in Tables 5 and 6 by the known chemical vapor deposition method and then subjected to estimation of the cutting properties, thus obtaining results as shown in Tables 5 and 6. The method of estimating the cutting properties is shown in Table 7.

In comparison of Sample Nos. 13, 14 and 15 of the present invention with Sample No. 10 for comparison, it is apparent that the samples of the present invention show lower quantities than the comparative sample as to the quantity of thermal deformation, flank wear width and breakage ratio, i.e. the former having more excellent cutting properties than the latter. In Sample Nos. 11, 12 and 13 for comparison, the film thickness of $Al_2O_3$ as the outermost layer only is changed and it is apparent from these results that the breakage ratio is increased with the increase of the thickness of $Al_2O_3$, while the thermal deformation and flank wear width are increased with the decrease of the thickness of $Al_2O_3$. Thus, it will clearly be understood that Sample No. 13 of the present invention is more excellent from the standpoint of overall cutting properties.

In Table 6, the total thickness of the coating layers is increased. It is apparent from these results that Sample Nos. 17 and 18 of the present invention show less quantities than Sample No. 16 for comparison as to the quantity of thermal deformation and flank wear width, i.e. showing more excellent cutting properties, but Sample No. 17 is not so different from Sample 16 as to the breakage ratio, which results are similar to those shown in Table 3 of Example 1. On the other hand, Sample No. 18 is more excellent than the comparative sample in all aspects. Therefore, when the film thickness of the each layer of TiC, TiCN or TiN is less than 2.5μ, a more excellent breakage resistance can also be obtained in the case of using $Al_2O_3$ coating layers in an analogous manner to the case of using Ti compounds coating layers.

TABLE 5

| Sample No. | Coating Layer Structure (μ) Inner Layer ←→ Outer Layer | | | | | | | | Total Thickness | Cutting Properties* (I) | (III) | (IV) |
|---|---|---|---|---|---|---|---|---|---|---|---|---|
| Comparison | | | | | | | | | | | | |
| 10 | TiC 5.0 | TiN 2.5 | $Al_2O_3$ 1.0 | | | | | | 8.5 | 0.144 | 0.275 | 59 |
| 11 | TiC 2.5 | TiN 2.5 | TiC 2.5 | $Al_2O_3$ 7.0 | | | | | 14.5 | 0.052 | 0.172 | 95 |
| 12 | TiC 2.5 | TiN 2.5 | TiC 2.5 | $Al_2O_3$ 0.3 | | | | | 7.8 | 0.152 | 0.312 | 50 |
| Our Invention | | | | | | | | | | | | |
| 13 | TiC 2.5 | TiN 2.5 | TiC 2.5 | $Al_2O_3$ 1.0 | | | | | 8.5 | 0.093 | 0.220 | 34 |
| 14 | TiC 2.0 | TiCN 1.0 | TiN 1.5 | TiCN 1.0 | TiC 2.0 | $Al_2O_3$ 1.0 | | | 8.5 | 0.095 | 0.203 | 21 |
| 15 | TiC 2.0 | TiCN 1.0 | TiN 1.5 | TiCN 1.0 | TiC 2.0 | TiBN 0.5 | $Al_2O_3$ 1.0 | TiN 0.5 | 9.5 | 0.094 | 0.201 | 23 |

Note:
*(I), (III), and (IV) same as in Table 2

TABLE 6

| Sample No. | Coating Layer Structure (μ) Inner Layer ←→ Outer Layer | | | | | | Total Thickness | Cutting Properties* (I) | (III) | (IV) |
|---|---|---|---|---|---|---|---|---|---|---|
| Comparison | | | | | | | | | | |
| 16 | TiC 6.5 | TiN 6.0 | $Al_2O_3$ 1.0 | | | | 13.5 | 0.072 | 0.163 | 87 |
| Our Invention | | | | | | | | | | |
| 17 | Tic 3.5 | TiN 6.0 | TiC 3.0 | $Al_2O_3$ 1.0 | | | 13.5 | 0.063 | 0.136 | 83 |
| 18 | TiC | TiCN | TiN | TiCN | TiC | $Al_2O_3$ | | | | |

TABLE 6-continued

| Sample No. | Coating Layer Structure (μ) Inner Layer ⟵⟶ Outer Layer | | | | | | Total Thickness | Cutting Properties* (I) | (III) | (IV) |
|---|---|---|---|---|---|---|---|---|---|---|
| | 2.5 | 2.5 | 2.5 | 2.5 | 2.5 | 1.0 | 13.5 | 0.061 | 0.134 | 62 |

Note:
*(I), (III) and (IV) same as in Table 2

TABLE 7

| | Workpiece (Hardness) | Cutting Speed (m/min) | Feed (mm. rev) | Depth of Cut (mm) | Cutting Time (min) | Tool Form No. |
|---|---|---|---|---|---|---|
| Quantity of Thermal Deformation* | SK 5 ($H_B$ 250) | 150 | 0.74 | 1.5 | 5 | SNMG 432 |
| Flank Wear Width | SCM 435 ($H_B$ 250) | 170 | 0.37 | 2.0 | 60 | SNMG 432 |
| Breakage Ratio** | SCM 435 with groove | 100 | 0.17–0.27 | 1.5 | 0.5 | SNMG 432 |

Note:
*, **same as in Table 4

What is claimed is:

1. A surface-coated cemented carbide having a hard coating layer on the surface thereof, in which the hard coating layer comprises:
   an inner layer of TiC having a thickness of 0.5 to 2.5μ,
   a penultimate layer of TiC having a thickness of 0.5 to 2.5μ,
   an intermediate layer, provided between said inner layer and penultimate layer, consisting of a composite layer with a TiN layer having a thickness of 0.5 to 2.5μ sandwiched between TiCN layers each having a thickness of 0.1 to 2.5μ, and
   an outer layer of $Al_2O_3$ with a thickness of 0.5 to 5μ provided on said penultimate layer.

2. The surface-coated cemented carbide article of claim 1, wherein the outermost layer of $Al_2O_3$ is coated through a bonding layer coated on the penultimate layer of TiC, the bonding layer consisting of at least one material selected from the group consisting of TiBN, TiCBN, TiCO, TiNO and TiCNO and having a thickness of 0.3 to 1μ.

3. The surface-coated cemented carbide article of claim 1, wherein the layer of TiC, the intermediate layer and the layer of TiC are repeated.

* * * * *